(12) United States Patent
Tsai et al.

(10) Patent No.: US 6,781,160 B1
(45) Date of Patent: Aug. 24, 2004

(54) SEMICONDUCTOR LIGHT EMITTING DEVICE AND METHOD FOR MANUFACTURING THE SAME

(75) Inventors: Tzong-Liang Tsai, Hsinchu (TW); Chih-Sung Chang, Hsinchu (TW); Tzer-Perng Chen, Hsinchu (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 10/603,378

(22) Filed: Jun. 24, 2003

(51) Int. Cl.[7] .......................... H01L 29/22; H01L 29/24
(52) U.S. Cl. ...................... 257/98; 257/103; 438/29; 438/42
(58) Field of Search .................... 257/84, 85, 86, 257/98, 99, 103; 438/29, 42

(56) References Cited

U.S. PATENT DOCUMENTS

| | | | | |
|---|---|---|---|---|
| 5,818,066 A | * | 10/1998 | Duboz | .......................... 257/21 |
| 6,252,253 B1 | * | 6/2001 | Bao et al. | ...................... 257/89 |
| 6,316,785 B1 | * | 11/2001 | Nunoue et al. | ............... 257/14 |
| 6,630,684 B2 | * | 10/2003 | Lee et al. | ...................... 257/40 |

* cited by examiner

Primary Examiner—Ngân V. Ngô
(74) Attorney, Agent, or Firm—Glenn Patent Group; Michael A. Glenn

(57) ABSTRACT

A semiconductor light emitting device and a method for manufacturing the same are disclosed. The semiconductor comprises a light scattering-deflecting layer located on a semiconductor layer having a scraggly surface. Light is deflected due to the difference of refractive index when the light enters the semiconductor layer from the light scattering-deflecting layer, and the light scatters when the light enters the scraggly surface of the semiconductor layer, thereby enabling the semiconductor light emitting device to emit more light so as to increase the light emitting efficiency of the semiconductor light emitting device.

30 Claims, 2 Drawing Sheets

SEMICONDUCTOR LIGHT EMITTING DEVICE AND METHOD FOR MANUFACTURING THE SAME

FIELD OF THE INVENTION

The present invention relates to a semiconductor light emitting device and a method for manufacturing the same, and more particularly, to a semiconductor light emitting device having a light scattering-deflecting layer and a method for manufacturing the same.

BACKGROUND OF THE INVENTION

Semiconductor light emitting devices, such as light emitting diodes (LED), are formed by using semiconductor materials. The semiconductor light emitting devices are one kind of minute solid-state light sources that can transform electrical energy into light energy. The semiconductor light emitting devices not only have the features of small volume, long life, low driving voltage, rapid response speed, and shockproof, but also can meet the needs of various application apparatuses of lightness, thinness, and miniaturization, thus having become very popular electric products in daily life.

Referring to FIG. 1, FIG. 1 illustrates a cross-sectional view of a conventional semiconductor light emitting device. In the formation of the semiconductor light emitting device, a semiconductor layer 102 is first formed on a substrate 100 that is transparent by using a deposition method, and a n-type semiconductor layer 104 is formed on the semiconductor layer 102 by using an epitaxy method. Then, a luminescent structure 106 is formed on the n-type semiconductor layer 104 by using an epitaxy method similarly. A p-type semiconductor layer 108 is formed on the luminescent structure 106 similarly by using an epitaxy method, wherein the n-type semiconductor layer 104, the luminescent structure 106, and the p-type semiconductor layer 108 constitute a semiconductor light emitting structure.

Next, a definition step is performed by using a photolithograph technique and an etching technique to remove a portion of the luminescent structure 106 and a portion of the p-type semiconductor layer 108, so as to expose a portion of the n-type semiconductor layer 104. Thereafter, an electrode 110 and an electrode 112 are formed respectively on the p-type semiconductor layer 108 and on the n-type semiconductor layer 104 by using a thermal evaporation method, an e-beam evaporation method, or an ion sputtering method, so as to complete the semiconductor light emitting device.

SUMMARY OF THE INVENTION

An objective of the present invention is to provide a semiconductor light emitting device, such as a light emitting diode, the semiconductor light emitting device comprising a semiconductor layer having a scraggly surface and a light scattering-deflecting layer of which a refractive index is different from that of the semiconductor layer. Therefore, light is deflected while the light enters the semiconductor layer from the light scattering-deflecting layer, and the light is scattered while the light enters the scraggly surface of the semiconductor layer, so that the semiconductor light emitting device emits more light.

Another objective of the present invention is to provide a method for manufacturing a semiconductor light emitting device, by forming a semiconductor layer having a scraggly surface, and then forming a light scattering-deflecting layer of which a refractive index is different from that of the semiconductor layer. Thus, after light is deflected by the light scattering-deflecting layer and scattered by the semiconductor layer, the light emitting efficiency of the semiconductor light emitting device can be enhanced.

According to the aforementioned objectives of the present invention, the present invention provides a semiconductor light emitting device comprising: a transparent substrate, wherein the transparent substrate comprises a semiconductor layer formed thereon, and the semiconductor layer comprises a scraggly surface; a light scattering-deflecting layer located on the scraggly surface of the semiconductor layer; and a semiconductor luminescent epitaxial structure located on the light scattering-deflecting layer. A refractive index of the light scattering-deflecting layer is different from that of the semiconductor layer.

According to a preferred embodiment of the present invention, the light scattering-deflecting layer can fill up and level the scraggly surface of the semiconductor layer, or can be conformal with the scraggly surface of the semiconductor layer.

According to the aforementioned objectives of the present invention, the present invention provides a method for manufacturing a semiconductor light emitting device comprising the following steps: providing a transparent substrate, wherein the transparent substrate comprises a semiconductor layer formed thereon, and the semiconductor layer comprises a scraggly surface; forming a light scattering-deflecting layer located on the scraggly surface of the semiconductor layer; and forming a semiconductor luminescent epitaxial structure located on the light scattering-deflecting layer.

According to a preferred embodiment of the present invention, the step of forming the light scattering-deflecting layer is performed by using a metal organic chemical vapor deposition (MOCVD) method to fill up and level the scraggly surface of the semiconductor layer.

The refractive index of the light scattering-deflecting layer is different from that of the semiconductor layer, and the semiconductor layer has a scraggly surface, so that light is deflected and scattered while the light enters the semiconductor layer from the light scattering-deflecting layer. Therefore, the semiconductor light emitting device can emit more light, thus achieving the objective of enhancing the light emitting efficiency.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a semiconductor light emitting device and a method for manufacturing the same, wherein the semiconductor light emitting device comprises a semiconductor layer having a scraggly surface and a light scattering-deflecting layer located on the semiconductor layer. Therefore, while light enters the semiconductor layer from the light scattering-deflecting layer, the light is deflected and scattered, whereby the semiconductor light emitting device can emit more light, and the light emitting efficiency can be increased. In order to make the illustration of the present invention more explicitly and completely, the following description is stated with reference to the accompanying drawings of FIG. 2 and FIG. 3.

Figure 1:
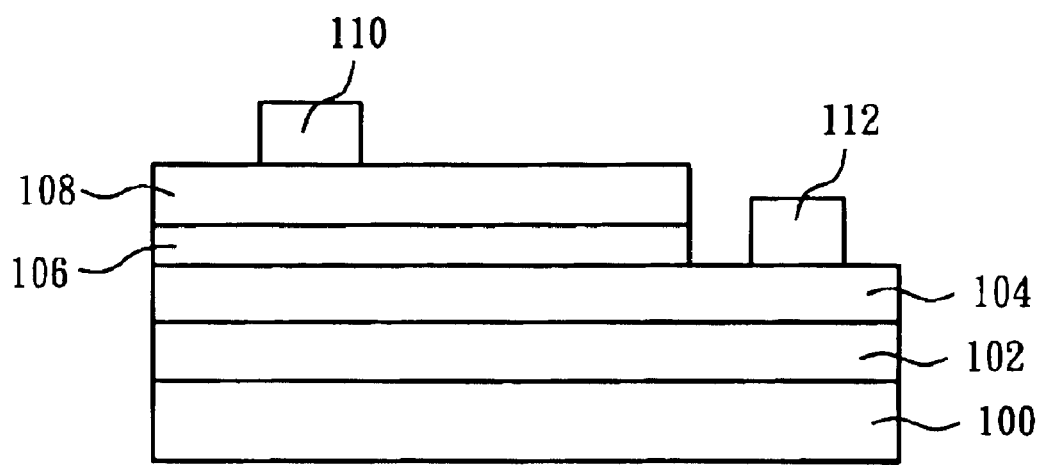
FIG. 1 illustrates a cross-sectional view of a conventional semiconductor light emitting device.
Figure 2:
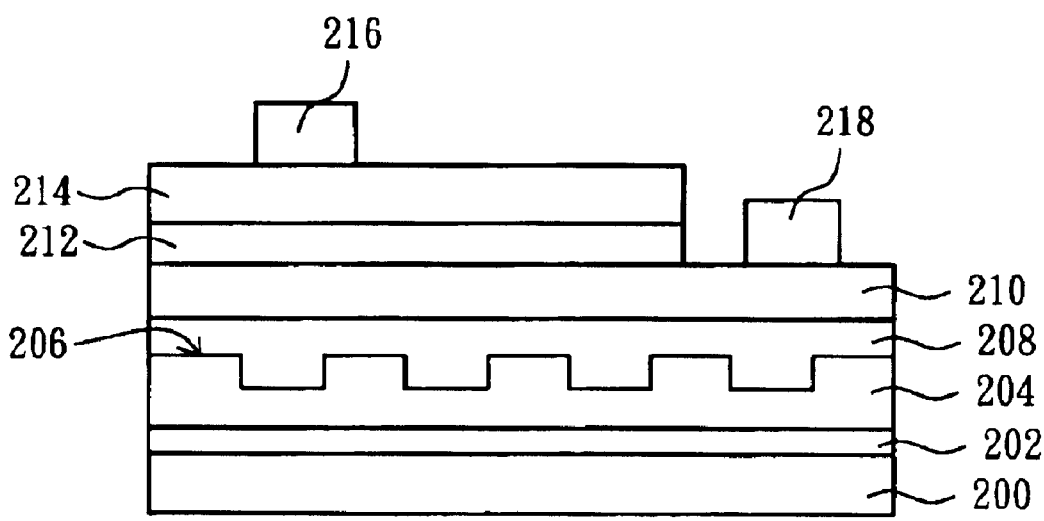
FIG. 2 illustrates a cross-sectional view of a semiconductor light emitting device in accordance with a preferred embodiment of the present invention.

Referring to FIG. 2, FIG. 2 illustrates a cross-sectional view of a semiconductor light emitting device in accordance with a preferred embodiment of the present invention. While forming the semiconductor light emitting device, a semiconductor buffer layer 202 is formed to cover a substrate 200 that is transparent by using such as a metal organic chemical vapor deposition method, wherein the material of the semiconductor buffer layer 202 can be, for example, a III–V semiconductor. Next, a semiconductor film (only a semiconductor layer 204 is shown) is formed to cover the semiconductor buffer layer 202 by using such as a metal organic chemical vapor deposition method. After the semiconductor film is formed, the semiconductor film is defined by using such as a photolithograph method and an etching method to remove a portion of the semiconductor film, so as to form the semiconductor layer 204 having a scraggly surface 206. While forming the scraggly surface 206 of the semiconductor layer 204, a wet etching method, a dry etching, or other appropriate methods can be used. In addition, the scraggly surface 206 of the semiconductor layer 204 can have a pattern such as bar convex, circle convex, octagon convex, hexagon convex, tetragon convex, triangle convex, bar concave, circle concave, octagon concave, hexagon concave, tetragon concave, or triangle concave, etc.

Then, a light scattering-deflecting layer 208 is formed to cover the scraggly surface 206 of the semiconductor layer 204 by using such as an evaporation method, a plating method, a metal organic chemical vapor deposition method, a molecular beam epitaxy method, or a hydride vapor phase epitaxy method, wherein, a refractive index of the light scattering-deflecting layer 208 is different from that of the semiconductor layer 204, and the material of the light scattering-deflecting layer 208 is a transparent material. The material of the light scattering-deflecting layer 208 can be Si, Ge, or III–V semiconductor, such as GaAs, InP, AlGaInP, GaN, AlN, InN, and AlInGaN, etc. The material of the light scattering-deflecting layer 208 can be a insulating material, such as $SiO_2$, $Si_3N_4$, TiN, $Al_2O_3$, MgO, $GaF_2$, ZnS, and SiC, etc. Furthermore, the material of the light scattering-deflecting layer 208 can further be a metal material, such as Cu, Ag, Au, Zn, Cd, Mg, Al, Ga, and In, etc.

Figure 3:
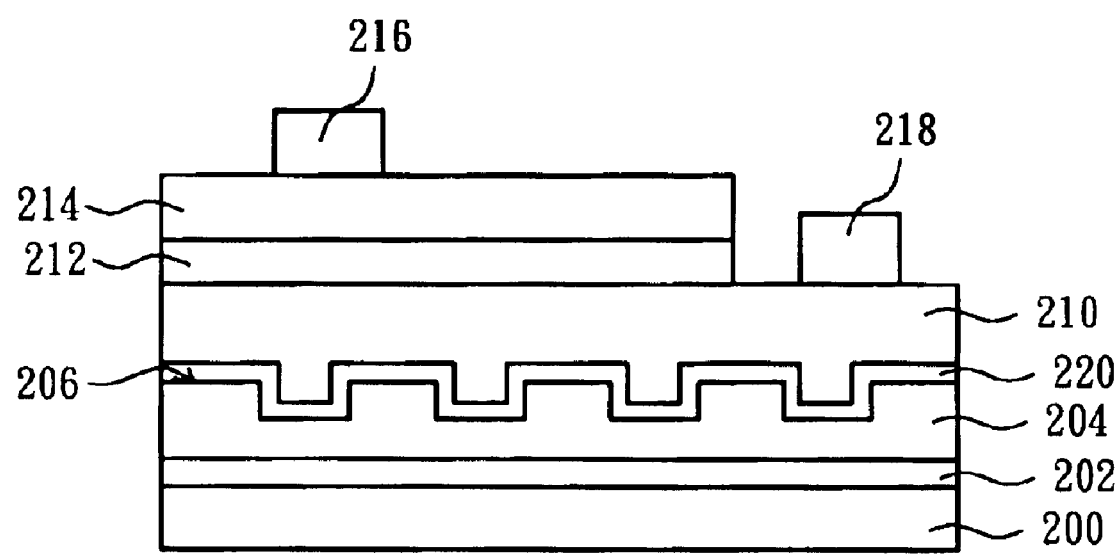
FIG. 3 illustrates a cross-sectional view of a semiconductor light emitting device in accordance with another preferred embodiment of the present invention.

It is worthy to be noted that, in the preferred embodiment, the light scattering-deflecting layer 208 fills up and levels the scraggly surface 206 of the semiconductor layer 204, such as shown in FIG. 2. However, referring to FIG. 3, FIG. 3 illustrates a cross-sectional view of a semiconductor light emitting device in accordance with another preferred embodiment of the present invention. The light scattering-deflecting layer 220 is conformal with the scraggly surface 206 of the semiconductor layer 204.

After the light scattering-deflecting layer 208 or the light scattering-deflecting layer 220 is formed, a semiconductor luminescent epitaxial structure can be grown. First, a n-type semiconductor layer 210 is grown to cover the light scattering-deflecting layer 208 or the light scattering-deflecting layer 220 by using an epitaxy method. Then, a luminescent structure 212 is formed to cover the n-type semiconductor layer 210, wherein the luminescent structure 212 can be such as a multiple quantum well (MQW) structure. Subsequently, a p-type semiconductor layer 214 is grown to cover the luminescent structure 212 to complete the semiconductor luminescent epitaxial structure.

After the p-type semiconductor layer 214 is formed, the p-type semiconductor layer 214 and the luminescent structure 212 are defined by using such as a photolithograph method and an etching method to remove a portion of the p-type semiconductor layer 214 and a portion of the luminescent structure 212, so as to expose a portion of the n-type semiconductor layer 210. Then, a p-type electrode 216 is formed on a portion of the p-type semiconductor layer 214, and a n-type electrode 218 is formed on the exposed portion of the n-type semiconductor layer 210 by using such as a plating method to complete the forming of the semiconductor light emitting device, such as a light emitting diode.

In one preferred embodiment of the present invention, the semiconductor buffer layer 202 with a thickness of 25 nm is formed on the substrate 200 that is transparent by using a metal organic chemical vapor deposition method under 550° C. wherein the material of the substrate 200 is $Al_2O_3$, and the material of the semiconductor buffer layer 202 is GaN. A semiconductor layer 204 with a thickness of 2 $\mu$m is formed on the semiconductor buffer layer 202 by using a metal organic chemical vapor deposition method under 1100° C. wherein the material of the semiconductor layer 204 is GaN. Then, a photoresist layer comprising a plurality of circle patterns with a diameter of 2 $\mu$m is formed on a surface of the semiconductor layer 204 by using a photolithograph method to expose a portion of the semiconductor layer 204, wherein the distance between two adjacent circle patterns is 2 $\mu$m. The semiconductor layer 204 is etched by using a reactive ion etching (RIE) method to form a plurality of circle concaves with a depth of about 1 $\mu$m.

Next, a AlN layer of about 1.5 $\mu$m in thickness of is grown by using a metal organic chemical vapor deposition method, and is used as the light scattering-deflecting layer 208, wherein the light scattering-deflecting layer 208 fills up and levels the circle concaves on the scraggly surface 206 of the semiconductor layer 204. A silicon-doped n-type GaN layer of 2 $\mu$m in thickness is grown by using an epitaxy method, and is used as the n-type semiconductor layer 210. After the n-type semiconductor layer 210 is formed, a multiple quantum well structure composed of five pairs of InGaN/GaN is grown by using an epitaxy method, and is used as the luminescent structure 212. A magnesium-doped p-type GaN layer of 0.5 $\mu$m in thickness is grown by using an epitaxy method under 1000° C. and is used as the p-type semiconductor layer 214.

Subsequently, a definition step is performed by using a reactive ion etching method to remove a portion of the p-type semiconductor layer 214 and a portion of the luminescent structure 212, so as to expose a portion of the n-type semiconductor layer 210. A Ni/Au layer is formed on the p-type semiconductor layer 214 to be used as the p-type electrode 216, and a Ti/Al layer is formed on the n-type semiconductor layer 210 to be used as the n-type electrode 218 by using a plating method, so as to complete the semiconductor light emitting device.

According to the experiment result, the light emitting brightness of a semiconductor light emitting device having a light scattering-deflecting layer formed by using the aforementioned process can be increased 5% to 15%.

A feature of the present invention is that: the semiconductor light emitting device of the present invention comprises the semiconductor layer 204 having the scraggly surface 206 and the light scattering-deflecting layer 208 (as shown in FIG. 2) or the light scattering-deflecting layer 220 (as shown in FIG. 3) of which a refractive index is different from that of the semiconductor layer 204. While light enters the light scattering-deflecting layer 208 or the light scattering-deflecting layer 220 from the luminescent structure 212 and through the n-type semiconductor layer 210, and enters the semiconductor layer 204 from the light scattering-deflecting layer 208 or the light scattering-deflecting layer 220, the light is deflected because the refractive index of the light scattering-deflecting layer 208 or that of the light scattering-deflecting layer 220 is different from that of the semiconductor layer 204. Besides, the light is scattered while the light enters the scraggly surface 206 because the junction surface between the semiconductor layer 204 and the light scattering-deflecting layer 208 or the light scattering-deflecting layer 220 is the scraggly surface 206. Therefore, while the light enters the semiconductor layer 204, the light is deflected and scattered at the same time, so as to emit more light and increase the light emitting efficiency of the semiconductor light emitting device.

According to the aforementioned description, one advantage of the present invention is that: because the semiconductor light emitting device of the present invention comprises a semiconductor layer having a scraggly surface and a light scattering-deflecting layer of which a refractive index differed from that of the semiconductor layer, light is deflected while the light entering the semiconductor layer from the light scattering-deflecting layer and is also scattered while the light entering the scraggly surface of the semiconductor layer, thus making the semiconductor light emitting device emit more light and increasing brightness of the semiconductor light emitting device effectively, so as to achieve the objective of enhancing the light emitting efficiency of the semiconductor light emitting device.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A semiconductor light emitting device, comprising:
a transparent substrate, wherein the transparent substrate comprises a semiconductor layer formed thereon, and the semiconductor layer comprises a scraggly surface;
a light scattering-deflecting layer located on the scraggly surface of the semiconductor layer; and
a semiconductor luminescent epitaxial structure located on the light scattering-deflecting layer.

2. The semiconductor light emitting device according to claim 1, wherein a refractive index of the light scattering-deflecting layer is different from a refractive index of the semiconductor layer.

3. The semiconductor light emitting device according to claim 1, wherein the material of the light scattering-deflecting layer is a transparent material.

4. The semiconductor light emitting device according to claim 1, wherein the material of the light scattering-deflecting layer is selected from the group consisting of Si, Ge, and III–IV semiconductor, wherein the III–IV semiconductor is selected from the group consisting of GaAs, InP, AlGaInP, GaN, AlN, InN, and AlInGaN.

5. The semiconductor light emitting device according to claim 1, wherein the material of the light scattering-deflecting layer is an insulating material, and the insulating material is selected from the group consisting of $SiO_2$, $Si_3N_4$, TiN, $Al_2O_3$, MgO, $GaF_2$, ZnS, and SiC.

6. The semiconductor light emitting device according to claim 1, wherein the material of the light scattering-deflecting layer is a metal material, and the metal material is selected from the group consisting of Cu, Ag, Au, Zn, Cd, Mg, Al, Ga, and In.

7. The semiconductor light emitting device according to claim 1, wherein the light scattering-deflecting layer and the semiconductor layer are conformal.

8. The semiconductor light emitting device according to claim 1, wherein the light scattering-deflecting layer fills up and levels the scraggly surface of the semiconductor layer.

9. The semiconductor light emitting device according to claim 1, wherein the pattern of the scraggly surface of the semiconductor layer is selected from the group consisting of bar convex, circle convex, octagon convex, hexagon convex, tetragon convex, triangle convex, bar concave, circle concave, octagon concave, hexagon concave, tetragon concave, and triangle concave.

10. The semiconductor light emitting device according to claim 1, wherein the semiconductor luminescent epitaxial structure comprises a n-type semiconductor layer, a luminescent structure, and a p-type semiconductor layer stacked in sequence.

11. A semiconductor light emitting device, comprising:
a transparent substrate, wherein the transparent substrate comprises a semiconductor layer formed thereon, and the semiconductor layer comprises a scraggly surface;
a light transparent layer located on the scraggly surface of the semiconductor layer, wherein a refractive index of the light transparent layer is different from a refractive index of the semiconductor layer; and
a semiconductor luminescent epitaxial structure located on the light transparent layer.

12. The semiconductor light emitting device according to claim 11, wherein the material of the light transparent layer is selected from the group consisting of Si, Ge, and III–V semiconductor, wherein the III–V semiconductor is selected from the group consisting of GaAs, InP, AlGaInP, GaN, AlN, InN, and AlInGaN.

13. The semiconductor light emitting device according to claim 11, wherein the material of the light transparent layer is an insulating material, and the insulating material is selected from the group consisting of $SiO_2$, $Si_3N_4$, TiN, $Al_2O_3$, MgO, $GaF_2$, ZnS, and SiC.

14. The semiconductor light emitting device according to claim 11, wherein the material of the light transparent layer is a metal material, and the metal material is selected from the group consisting of Cu, Ag, Au, Zn, Cd, Mg, Al, Ga, and In.

15. The semiconductor light emitting device according to claim 11, wherein the light transparent layer and the semiconductor layer are conformal.

16. The semiconductor light emitting device according to claim 11, wherein the light transparent layer fills up and levels the scraggly surface of the semiconductor layer.

17. The semiconductor light emitting device according to claim 11, wherein the pattern of the scraggly surface of the semiconductor layer is selected from the group consisting of bar convex, circle convex, octagon convex, hexagon convex, tetragon convex, triangle convex, bar concave, circle concave, octagon concave, hexagon concave, tetragon concave, and triangle concave.

18. The semiconductor light emitting device according to claim 11, wherein the semiconductor luminescent epitaxial structure comprises a n-type semiconductor layer, a luminescent structure, and a p-type semiconductor layer stacked in sequence.

19. A method for manufacturing a semiconductor light emitting device, comprising:
   providing a transparent substrate, wherein the transparent substrate comprises a semiconductor layer formed thereon, and the semiconductor layer comprises a scraggly surface;
   forming a light scattering-deflecting layer located on the scraggly surface of the semiconductor layer; and
   forming a semiconductor luminescent epitaxial structure located on the light scattering-deflecting layer.

20. The method for manufacturing the semiconductor light emitting device according to claim 19, wherein a refractive index of the light scattering-deflecting layer is different from a refractive index of the semiconductor layer.

21. The method for manufacturing the semiconductor light emitting device according to claim 19, wherein the material of the light scattering-deflecting layer is a transparent material.

22. The method for manufacturing the semiconductor light emitting device according to claim 19, wherein the material of the light scattering-deflecting layer is selected from the group consisting of Si, Ge, and III–V semiconductor, wherein the III–V semiconductor is selected from the group consisting of GaAs, InP, AlGaInP, GaN, AlN, InN, and AlInGaN.

23. The method for manufacturing the semiconductor light emitting device according to claim 19, wherein the material of the light scattering-deflecting layer is an insulating material, and the insulating material is selected from the group consisting of $SiO_2$, $Si_3N_4$, TiN, $Al_2O_3$, MgO, $GaF_2$, ZnS, and SiC.

24. The method for manufacturing the semiconductor light emitting device according to claim 19, wherein the material of the light scattering-deflecting layer is a metal material, and the metal material is selected from the group consisting of Cu, Ag, Au, Zn, Cd, Mg, Al, Ga, and In.

25. The method for manufacturing the semiconductor light emitting device according to claim 19, wherein the light scattering-deflecting layer and the semiconductor layer are conformal.

26. The method for manufacturing the semiconductor light emitting device according to claim 19, wherein the light scattering-deflecting layer fills up and levels the scraggly surface of the semiconductor layer.

27. The method for manufacturing the semiconductor light emitting device according to claim 19, wherein the step of forming the light scattering-deflecting layer is performed by using a method selected from the group consisting of an evaporation method, a plating method, a metal organic chemical vapor deposition method, a molecular beam epitaxy method, and a hydride vapor phase epitaxy method.

28. The method for manufacturing the semiconductor light emitting device according to claim 19, wherein the pattern of the scraggly surface of the semiconductor layer is selected from the group consisting of bar convex, circle convex, octagon convex, hexagon convex, tetragon convex, triangle convex, bar concave, circle concave, octagon concave, hexagon concave, tetragon concave, and triangle concave.

29. The method for manufacturing the semiconductor light emitting device according to claim 19, wherein the semiconductor luminescent epitaxial structure comprises a n-type semiconductor layer, a luminescent structure, and a p-type semiconductor layer stacked in sequence.

30. The method for manufacturing the semiconductor light emitting device according to claim 29, after the step of forming the semiconductor luminescent epitaxial structure is performed, further comprising:
   removing a portion of the p-type semiconductor layer and a portion of the luminescent structure to expose a portion of the n-type semiconductor layer;
   forming a p-type electrode on the p-type semiconductor layer; and
   forming a n-type electrode on the exposed portion of the n-type semiconductor layer.

* * * * *